(12) United States Patent
Fukui et al.

(10) Patent No.: US 11,118,076 B2
(45) Date of Patent: Sep. 14, 2021

(54) BLACK MARKER COMPOSITION AND ELECTRONIC COMPONENT USING THE SAME

(71) Applicant: TDK CORPORATION, Tokyo (JP)

(72) Inventors: Takashi Fukui, Tokyo (JP); Osamu Hirose, Tokyo (JP); Masanori Abe, Tokyo (JP); Kazunari Kimura, Tokyo (JP); Hisashi Kobuke, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/830,403

(22) Filed: Mar. 26, 2020

(65) Prior Publication Data

US 2020/0308429 A1    Oct. 1, 2020

(30) Foreign Application Priority Data

Mar. 29, 2019    (JP) .............. JP2019-068652

(51) Int. Cl.
*C09D 11/17* (2014.01)
*H03H 1/00* (2006.01)
*C08K 13/02* (2006.01)

(52) U.S. Cl.
CPC .............. *C09D 11/17* (2013.01); *H03H 1/00* (2013.01); *C08K 13/02* (2013.01); *H03H 2001/0085* (2013.01); *H03H 2001/0092* (2013.01)

(58) Field of Classification Search
CPC ... H03H 2001/0085; H03H 1/00; C09D 17/00
USPC .......................................................... 333/185
See application file for complete search history.

(56) References Cited

U.S. PATENT DOCUMENTS

| | | | |
|---|---|---|---|
| 2009/0134956 A1 | 5/2009 | Hadano et al. | |
| 2010/0230646 A1* | 9/2010 | Smith | C03C 8/16 252/519.13 |
| 2014/0299016 A1 | 10/2014 | Tabata et al. | |
| 2014/0375736 A1 | 12/2014 | Ogino et al. | |
| 2017/0362119 A1* | 12/2017 | Dejneka | C03C 3/15 |

FOREIGN PATENT DOCUMENTS

| | | |
|---|---|---|
| JP | 2005-064267 A | 3/2005 |
| JP | 2008-021752 A | 1/2008 |
| JP | 2013-151620 A | 8/2013 |
| JP | 5888277 B2 | 3/2016 |

* cited by examiner

*Primary Examiner* — Rakesh B Patel
(74) *Attorney, Agent, or Firm* — Oliff PLC

(57) ABSTRACT

Provided is a more versatile black marker composition which achieves excellent adhesion between a mark and an electronic component element body and excellent contrast of a mark regardless of the composition of the electronic component element body, the black marker composition containing borosilicate glass and a black oxide, in which a crystallization temperature of the borosilicate glass is less than 910° C., and an amount of Zn in terms of ZnO is 0.05% by mass or less based on 100% by mass of an inorganic solid content in terms of an oxide contained in the black marker composition.

15 Claims, 1 Drawing Sheet

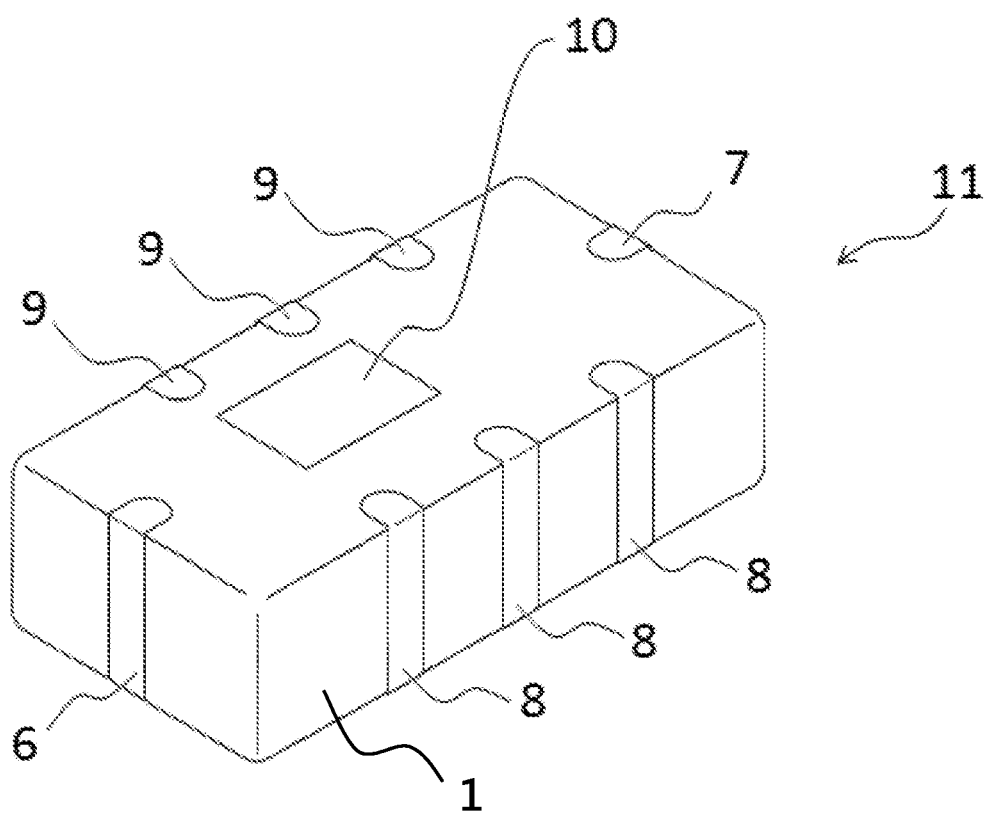

BLACK MARKER COMPOSITION AND ELECTRONIC COMPONENT USING THE SAME

BACKGROUND OF THE INVENTION

Field of the Invention

The present invention relates to a black marker composition, an electronic component having a mark formed of the black marker composition, and a communication device having the electronic component.

Description of the Related Art

In some electronic components, marks are provided on the surfaces of the components for the purpose of specifying mounting directions so as to avoid mistakes in mounting and mistakes in manufacturing the electronic components. Marking materials including metallic materials are widely used for the marks of electronic components (Japanese Patent Laid-Open No. 2005-64267 and Japanese Patent Laid-Open No. 2008-21752).

However, for such a mark formed of a metallic material, the shape and the position of the mark are restricted because it is needed to consider a short circuit between the mark and a terminal electrode provided on an electronic component. In particular, downsizing and high functionalization of devices are strongly required recently, and the above problem has become more remarkable. Specifically, due to the downsizing of devices, the distance between an electrode and the mark becomes shorter, and accordingly, when a mark is formed of a metallic material, the electrode and the mark readily contact with each other to cause a short circuit to easily occur.

In order to solve such a problem, a technique for forming a mark by a material other than metals into a mark has been proposed (Japanese Patent No. 5888277). Japanese Patent No. 5888277 discloses an electronic component having a marker made of a black marker composition comprising:

a borosilicate glass;

a black oxide including Cr, Mn, and one or more elements selected from the group consisting of Fe, Ni, Cu, and Co; and one or more compounds selected from the group consisting of $Al_2O_3$, $TiO_2$, $ZrO_2$, $Mg_2SiO_4$, and a strontium feldspar, wherein the content of the borosilicate glass in the black marker composition is 45 to 85% by mass, the content of the one or more compounds selected from the group consisting of $Al_2O_3$, $TiO_2$, $ZrO_2$, $Mg_2SiO_4$, and a strontium feldspar in the black marker composition is 5 to 20% by mass, and an electronic component element body of the electronic component has Ba—Nd—Ti-based ceramic composition as a main component.

The black marker composition described in Japanese Patent No. 5888277 is particularly preferably used for marking an electronic component in which an electronic component element body thereof includes a Ba—Nd—Ti-based ceramic composition as a main component, and achieves excellent adhesion and contrast between a mark and the element body. However, the present inventors have found that adhesion between a mark and an element body and contrast of a mark deteriorate depending on the composition of the electronic component element body.

Accordingly, an object of the present invention is to provide a more versatile black marker composition which achieves excellent adhesion between a mark and an electronic component element body and excellent contrast of a mark regardless of the composition of the electronic component element body.

SUMMARY OF THE INVENTION

The present invention solving the above object includes the following aspects.

(1) A black marker composition containing borosilicate glass and a black oxide, wherein a crystallization temperature of the borosilicate glass is less than 910° C., and an amount of Zn in terms of ZnO is 0.05% by mass or less based on 100% by mass of an inorganic solid content in terms of oxides contained in the black marker composition.

(2) The black marker composition according to (1), wherein the crystallization temperature of the borosilicate glass is 850° C. or more.

(3) The black marker composition according to (1) or (2), wherein a softening point of the borosilicate glass is equal to or less than the crystallization temperature and is within a range of 700° C.-850° C.

(4) The black marker composition according to any one of (1) to (3), wherein an amount of the borosilicate glass is 50 to 90% by mass.

(5) The black marker composition according to any one of (1) to (4), wherein an amount of the black oxide is 5 to 30% by mass.

(6) The black marker composition according to any one of (1) to (5), containing one or more additive oxides selected from the group consisting of $ZrO_2$, $Al_2O_3$, $TiO_2$, and $Mg_2SiO_4$.

(7) The black marker composition according to (6), wherein the additive oxide includes $ZrO_2$.

(8) The black marker composition according to (6) or (7), wherein an amount of the additive oxide is 2.5 to 30% by mass.

(9) The black marker composition according to any one of (1) to (8), wherein the black oxide contains Fe and Mn and also contains one or more elements selected from the group consisting of Cr, Ni, Cu, and Co.

(10) An electronic component having a mark formed of the black marker composition according to any one of (1) to (9) on a surface of an element body.

(11) The electronic component according to (10), wherein the element body has a structure in which a dielectric layer and an internal electrode layer are stacked, the internal electrode includes Ag, and the dielectric layer is capable of being fired simultaneously with Ag and includes a dielectric ceramic composition sinterable at a temperature of 910° C. or less.

(12) The electronic component according to (11), wherein the dielectric ceramic composition contains one or more selected from the group consisting of $Mg_2SiO_4$, ($Ca_xBa_ySr_{1-x-y}$)$TiO_3$ in which x and y are 1.0 to 0.0, and a $BaO$—$Nd_2O_3$—$TiO_2$-based ceramic.

(13) A communication device having the electronic component according to any one of (10) to (12).

BRIEF DESCRIPTION OF THE DRAWING

FIGURE shows an electronic component according to an embodiment of the present invention.

DETAILED DESCRIPTION OF THE PREFERRED EMBODIMENT

Hereinafter, the present invention will be described based on an embodiment shown in the drawing.

(Electronic Component 11)

As shown in the FIGURE, a high frequency filter 11 as one embodiment of the electronic component according to the present invention has an element body 1 as a main part and terminal electrodes 6 to 9 formed on the element body 1. The terminal electrodes 6 to 9 are electrically connected to an internal electrode of the element body 1. The terminal electrodes 6 to 9 may be formed on the back face of the element body 1 besides the configuration in which the terminal electrodes 6 to 9 are formed at end parts as shown in the FIGURE. A mark 10 for indicating a direction is formed on the front face of the element body 1.

(Mark 10)

A shape of the mark 10 is not particularly limited and appropriately selected from a rectangular shape, a triangle shape, a spherical shape, and the like. An area of the mark is not particularly limited and may be set to an appropriate size depending on the purpose of use. A thickness of the mark is not particularly limited. The mark 10 is made by firing a black marker composition according to the present invention.

(Black Marker Composition)

The black marker composition of the present embodiment contains borosilicate glass and a black oxide.

(Borosilicate Glass)

A crystallization temperature of the borosilicate glass is less than 910° C. and preferably within a range of 850° C. or more and less than 910° C. When the crystallization temperature of the borosilicate glass contained in the black marker composition is within the above range, the borosilicate glass crystallizes almost simultaneously with sintering of a dielectric ceramic composition. Consequently, toughness of the mark is enhanced, and breaking of the mark or the like hardly occurs.

A softening point of the borosilicate glass is equal to or less than the crystallization temperature, and is preferably within a range of 700° C.-850° C., and more preferably within a range of 800° C.-830° C. By virtue of using the borosilicate glass having the softening point within the above range for the marker composition, the shape of the mark follows shrinkage of the element body during firing the element body. Therefore, adhesion between the element body and the mark is enhanced, and dropping and breaking of the mark are prevented.

In the present embodiment, the borosilicate glass is an oxide containing boron and silicon and may further contain aluminum, barium, calcium, magnesium, and the like.

An amount of boron in the borosilicate glass is preferably within a range of 0.5-50% by mass in terms of $B_2O_3$. An amount of silicon in the borosilicate glass is preferably within a range of 10-80% by mass in terms of $SiO_2$.

When the borosilicate glass contains aluminum, barium, calcium, and magnesium, a total amount thereof is preferably within a range of 10-80% by mass in terms of oxides.

While the crystallization temperature and the softening point of the borosilicate glass are controlled by a glass composition, glass having an appropriate crystallization temperature and an appropriate softening point is available from commercial products.

In the black marker composition according to the present embodiment, an amount of the borosilicate glass is preferably 50 to 90% by mass and more preferably 60 to 80% by mass. When the amount of the borosilicate glass is within the above range, a nonmetallic mark sufficiently securing adhesive strength and contrast relative to a material of the element body may be formed.

(Black Oxide)

The black oxide used for the black marker composition of the present embodiment is not particularly limited, and various black oxides having been used as mark materials are appropriately used. Specific examples of the black oxide are described in, for example, Japanese Patent Laid-Open No. H6-340447, Japanese Patent Laid-Open No. H6-144871, Japanese Patent Laid-Open No. 2000-264639, Japanese Patent Laid-Open No. 2007-217544, and Japanese Patent Laid-Open No. 2010-77197 in detail. A preferable black oxide contains Fe and Mn and also contains one or more elements selected from the group consisting of Cr, Ni, Cu, and Co. Preferable examples of such a black oxide are a black oxide containing Fe, Mn, Cr, and Ni; a black oxide containing Fe, Mn, Cr, and Co; a black oxide containing Fe, Mn, Cr, and Cu; and a black oxide containing Fe, Mn, and Cu. Among them, a black oxide containing Fe, Mn, Cr, and Ni is more preferable in terms of forming a mark with good contrast relative to the element body and obtaining excellent adhesive strength. The black oxide may further contain one or more selected from rare earth elements such as La in addition to the above elements.

An amount of the black oxide in the black marker composition is preferably 5 to 30% by mass and more preferably 10 to 20% by mass. When the amount of the black oxide is within the above range, a nonmetallic mark sufficiently securing adhesive strength and contrast relative to the element body may be formed.

(Other Additive Oxides)

It is preferable that the black marker composition according to the present embodiment further contain one or more oxides selected from the group consisting of $ZrO_2$, $Al_2O_3$, $TiO_2$, and $Mg_2SiO_4$. An amount of said oxide in the black marker composition is preferably 30% by mass or less and more preferably 2.5 to 30% by mass. When the amount of said oxide is within the above range, a nonmetallic mark sufficiently securing adhesive strength to the element body and contrast relative to a material of the element body may be formed. Such oxides are also preferable on matching the shrinkage factor thereof with the shrinkage factor of a material of the element body. Among the above-described oxides, $ZrO_2$ is preferably used in the black marker composition of the present embodiment.

The black marker composition according to the present embodiment may further contain borosilicate glass having a crystallization temperature of 910° C. or more and may contain glass other than borosilicate glass as necessary.

It is preferable that the black marker composition be free from zinc. Specifically, the amount of Zn in terms of ZnO is 0.05% by mass or less, preferably 0.03% by mass or less, more preferably 0.01% by mass or less, and especially preferably 0% by mass based on 100% by mass of an inorganic solid content contained in the black marker composition in terms of oxides. When a large amount of Zn is contained in the black marker composition, Zn readily moves to the element body side during sintering depending on the composition of the element body. Movement of Zn to the element body side is often accompanied by metal components such as Fe and Mn contained in the black oxide. Consequently, an amount of a coloring component in the mark decreases, and contrast of the mark deteriorates. On the other hand, since the borosilicate glass contained in the black marker composition of the present embodiment is substantially free from Zn, movement of Zn from the mark to the element body does not occur. Accordingly, metal components contained in the black oxide do not transfer to the element body side. As a result, according to the black marker composition of the present embodiment, a mark with high contrast is obtained. In addition, the black marker composition of the present embodiment can be preferably used for both of an element body containing Zn and an element body free from Zn.

By virtue of satisfying the above features, the black marker composition according to the present embodiment can form a nonmetallic mark sufficiently securing adhesive strength to the element body and contrast relative to a material of the element body.

Furthermore, since the black marker composition according to the present embodiment can form a nonmetallic mark, stray capacitance does not occur even in a case where an electrode pattern is disposed in the vicinity of the mark, and no short circuit occurs even in a case where a terminal and the mark contact with each other. Therefore, according to such a black marker composition, a shape of the terminal electrode as well as a shape of the mark and a position at which the mark is formed can be freely set, and miniaturization of an electronic component is possible.

(Element Body 1)

While the element body 1 is not particularly limited, the element body 1 has a structure in which simultaneously fired plural dielectric layers and an internal electrode layer are stacked. In the present embodiment, the term "firing" means heat treatment for the purpose of sintering, and a firing temperature is a temperature of an atmosphere to which the dielectric ceramic composition is exposed during heat treatment.

While the dielectric layer is not particularly limited, the dielectric layer includes a dielectric ceramic composition capable of being fired simultaneously with the internal electrode. It is preferable that the dielectric ceramic composition be forsterite ($Mg_2SiO_4$), ($Ca_xBa_ySr_{1-x-y}$)$TiO_3$ in which x and y are 1.0 to 0.0, or a glass ceramic. The element body 1 may include enstatite ($Mg_2Si_2O_6$), alumina ($Al_2O_3$), or silica ($SiO_2$) as a main component.

The dielectric ceramic composition forming the dielectric layer may be a composition containing a BaO—$Nd_2O_3$—$TiO_2$-based ceramic as a main component. The BaO—$Nd_2O_3$—$TiO_2$-based ceramic has a high dielectric constant ($\varepsilon$) and is capable of being fired at a low temperature. Therefore, the BaO—$Nd_2O_3$—$TiO_2$-based ceramic is preferable even in the case of using Ag or the like as the internal electrode. Theses main components may be used singly or in combinations of two or more thereof.

Among these dielectric ceramic compositions, a material capable of being fired simultaneously with Ag, which is preferably used as the internal electrode, and sinterable at a temperature of 910° C. or less is preferably used. A particularly preferable dielectric ceramic composition contains one or more selected from the group consisting of forsterite ($Mg_2SiO_4$), ($Ca_xBa_ySr_{1-x-y}$)$TiO_3$ in which x and y are 1.0 to 0.0, and a BaO—$Nd_2O_3$—$TiO_2$-based ceramic as a main component.

The dielectric ceramic composition may contain one or more selected from $SiO_2$, $Li_2O$, $Al_2O_3$, CaO, BaO, $B_2O_3$, and ZnO as an accessory component in addition to the main component. These accessory components may be added as respective single oxides and may be added as a composite oxide or glass. Among them, glass which contains $SiO_2$ and $Li_2O$ and also contains one or more selected from $Al_2O_3$, CaO, BaO, $B_2O_3$, and ZnO is preferably used.

In the dielectric ceramic composition, the accessory component is preferably used in an amount of 2 to 20 parts by mass and more preferably 4 to 15 parts by mass in terms of an oxide per 100 parts by mass of the main component.

A compound which forms an oxide when the compound is fired through heat treatment such as calcination described later may also be used as a raw material of the accessory component. Examples of the compound forming the above-described oxides through firing include carbonates, nitrates, oxalates, hydroxides, sulfides, and organometallic compounds.

The dielectric ceramic composition is obtained by weighing the above-described main component and accessory component followed by mixing and firing. Mixing may be conducted by a mixing method such as dry mixing or wet mixing, and may be conducted, for example, by a mixing method using a solvent such as pure water and ethanol with a mixing and dispersing device such as a ball mill. A mixing time may be about 4 hours or longer and about 24 hours or shorter. The obtained dielectric ceramic composition is made into a paste, and the paste is subsequently made into a green sheet by coating and drying. The green sheet is used for manufacturing the element body.

(Internal Electrode)

While the internal electrode layer is not particularly limited, the internal electrode layer contains Ag as a conductive material, and Ag, Ag alloy (for example, Ag—Pd alloy, and Ag containing a trace of Zr), and the like are preferably used as the conductive material.

(Terminal Electrodes 6 to 9)

While the conductive material contained in the terminal electrodes is not particularly limited, Ag, Cu, and an alloy thereof may be used in the present embodiment.

(Manufacturing Method of Electronic Component)

One example of a manufacturing method of the electronic component 11 according to the present embodiment will be described.

Forming Method of Mark (Black Marker Composition)

A forming method of the mark is not particularly limited as long as the method can uniformly form the mark, and examples thereof include a screen printing method or gravure printing method using a paste of the black marker composition, and a thick film forming method such as offset printing.

A marking paste contains the borosilicate glass, the black oxide, various oxides added as necessary, a solvent, an organic vehicle, and the like. The marking paste is formed by making these components into paste.

In addition to the above-described components, various oxides, an organometallic compound, a resinate, and the like which form components of the black marker composition described above after firing may also be used as materials used for manufacturing the marking paste.

Shapes of the raw materials of the black marker composition are not particularly limited and may be spherical, flake, and the like, and these shapes may be mixed. An average grain size of each powdery material may be preferably about 0.8 µm to about 1.2 µm.

Examples of a binder resin contained in the marking paste include ethyl cellulose and polyvinyl butyral, and ethyl cellulose is preferably used. The binder resin is preferably contained in the marking paste in an amount of 3 to 15 parts by mass per 100 parts by mass of the raw materials of the black marker composition (the borosilicate glass, the black oxide, and the oxides added as necessary).

An organic solvent incompatible with a paste for a green sheet is preferably used as an organic solvent of the marking paste. Examples of the marking paste include terpineol and dihydroterpineol, and dihydroterpineol is preferably used. A solvent amount in the marking paste is preferably about 20% to about 60% by mass based on the total amount of the marking paste.

The marking paste may contain a dispersant, a plasticizer and an adhesive, and others such as additive powder as necessary. Consequently, a uniform mark is formed and adhesive strength is improved.

Formation of Element Body 1

Next, a representative manufacturing method of the element body 1 will be described. An internal electrode paste is firstly printed on a green sheet to provide a green sheet on which an internal electrode paste layer is formed. The internal electrode paste layer is a part to be the internal electrode layer after firing.

The marking paste is printed on a green sheet to provide a green sheet on which an unfired mark is formed. The unfired mark is a part to be the mark 10 after firing.

The green sheet with the unfired mark formed thereon and the green sheet with the internal electrode paste layer formed thereon are stacked to provide a stacked body, and the stacked body is cut into a predetermined shape to obtain a green chip. At this time, the green sheets are stacked so that the face on which the mark is formed becomes the top face. Alternatively, green sheets may be stacked without forming the unfired mark, and the unfired mark may be formed at a predetermined part of the stacked body. Incidentally, a layer of a thin green sheet may be further stacked on the face on which the unfired mark is formed in order to enhance durability of the mark.

The stacked body is cut into a green chip having a predetermined shape. Thereafter, binder removal treatment and firing treatment are performed. The firing temperature is 910° C. or less and may be a temperature equal to or higher than the crystallization temperature of the borosilicate glass. A firing time may be a time allowing the element body to be sintered and allowing the borosilicate glass contained in the black marker composition to crystallize. Usually, the firing time may be about 0.5 to about 10 hours. Other conditions are the same as the conditions generally employed.

As described above, the element body 1 is obtained through binder removal treatment and firing. The terminal electrodes 6 to 9 are formed by printing or transferring the external electrode paste to the element body 1 followed by firing. Then, a coating layer is formed on the surfaces of the terminal electrodes 6 to 9 by plating or the like as necessary. In this manner, the high frequency filter 11 is manufactured. The high frequency filter 11 is mounted on a printed circuit board by soldering or the like and used for various electronic devices and the like.

Particularly, the electronic component according to the present invention is preferably used for communication devices such as personal computers, smartphones, and portable communication terminals.

While a high frequency filter is illustrated as the electronic component according to the present invention in the above-described embodiment, the electronic component according to the present invention is not limited to such a multilayer filter and can be used for a multilayer electronic component such as a multilayer inductor. In addition, the black marker composition of the present invention is also applicable to an electrode protection layer and the like, for example. In addition, the mark is not only applied for recognition of a mounting direction of the electronic component but also applied for an alignment mark during manufacturing and identification of a product and the like Examples Hereinafter, the present invention will be described in detail with reference to examples. However, the present invention is not limited to these examples. Incidentally, a contrast test, a peeling test, and evaluation on cracking and the like were performed as follows in the following working examples and comparative examples.

Contrast Test (Visibility)

Whether a direction identification mark could be recognized by image recognition with a camera or not was examined. Evaluation was performed on 100 evaluation samples, and the proportion of samples in which direction identification marks were not recognized in respective images was taken as a defective rate. A defective rate of 0% was evaluated as A, a defective rate of more than 0% and 10% or less was evaluated as B, a defective rate of more than 10% and 20% or less was evaluated as C, a defective rate of more than 20% and 30% or less was evaluated as D, and a defective rate of more than 30% was evaluated as E.

Peeling Test (Adhesiveness)

Adhesive tape was attached to a mark-forming part of each of 100 evaluation samples, and the proportion of samples in which peeling occurs in the mark-forming part on tearing off the adhesive tape was taken as a defective rate. A defective rate of 0% was evaluated as A, a defective rate of more than 0% and 10% or less was evaluated as B, a defective rate of more than 10% and 20% or less was evaluated as C, a defective rate of more than 20% and 30% or less was evaluated as D, and a defective rate of more than 30% was evaluated as E.

Evaluation on Cracking and Breaking

Each of 100 evaluation samples was polished to arrive at the position at which a black mark had been formed, and the cross-section thereof was observed to check whether cracking or breaking had occurred or not. The proportion of samples in which cracking or breaking was observed was taken as a defective rate. A defective rate of 0% was evaluated as A, a defective rate of more than 0% and 10% or less was evaluated as B, a defective rate of more than 10% and 20% or less was evaluated as C, a defective rate of more than 20% and 30% or less was evaluated as D, and a defective rate of more than 30% was evaluated as E.

Total Evaluation

The highest defective rate among the above evaluation results was taken as a total evaluation.

Amount of Zn in Black Marker Composition

Each of marking pastes prepared in the working examples and comparative examples was subjected to binder removal treatment at 400° C. in a crucible, and fluorescent X-ray analysis (XRF) of the residual solid component was conducted to analyze the composition. As a result, it was confirmed that all marking pastes prepared in working examples contain ZnO in an amount of 0.05% by mass or less. With respect to pastes used in comparative examples, paste 12 contains 1.0% by mass of ZnO, and each of paste 14 and paste 16 contains 5.0% by mass of ZnO.

Softening Point and Crystallization Temperature of Glass

The softening point and crystallization temperature of borosilicate glass were determined from a differential thermal curve obtained by a differential thermal analyzer. Measurement was conducted at a temperature increase rate of 10° C./minute by using glass powder.

Preparation of Marking Paste (Black Oxide)

The following black oxides were provided.

Black oxide 1: a composite oxide containing Mn and Fe

Black oxide 2: a composite oxide containing Mn, Fe, Ni, and Cr

Black oxide 3: a composite oxide containing Mn, Fe, and Cu

Black oxide 4: a composite oxide containing Mn, Fe, and Co (Borosilicate Glass)

The following borosilicate glass samples respectively having compositions shown in the following table were provided. The symbol "○" in the table means that each glass sample contains components provided with the symbol. The softening points and crystallization temperatures of respective borosilicate glass samples are also shown in the table. Although the constituent elements of glass Nos. 1 and 7 to 15 are the same, the softening points and crystallization temperatures of these glass samples are different because compositional rates thereof are different from each other.

TABLE 1

| Glass No. | Composition | | | | | | | | | Softening point (° C.) | Crystallization temperature (° C.) |
| --- | --- | --- | --- | --- | --- | --- | --- | --- | --- | --- | --- |
| | $SiO_2$ | $B_2O_3$ | $Al_2O_3$ | BaO | CaO | MgO | $TiO_2$ | $Nd_2O_3$ | ZnO | | |
| 1 | ○ | ○ | ○ | ○ | ○ | ○ | | | | 820 | 900 |
| 2 | ○ | ○ | ○ | ○ | ○ | ○ | | | ○ | 800 | 880 |
| 3 | ○ | ○ | ○ | ○ | | | ○ | ○ | | 840 | 909 |
| 4 | ○ | ○ | ○ | ○ | | | ○ | ○ | ○ | 800 | 860 |
| 5 | ○ | ○ | ○ | ○ | | | | | | 840 | 900 |
| 6 | ○ | ○ | ○ | ○ | | | | | ○ | 810 | 880 |
| 7 | ○ | ○ | ○ | ○ | ○ | ○ | | | | 800 | 880 |
| 8 | ○ | ○ | ○ | ○ | ○ | ○ | | | | 760 | 850 |
| 9 | ○ | ○ | ○ | ○ | ○ | ○ | | | | 700 | 850 |
| 10 | ○ | ○ | ○ | ○ | ○ | ○ | | | | 690 | 850 |
| 11 | ○ | ○ | ○ | ○ | ○ | ○ | | | | 830 | 909 |
| 12 | ○ | ○ | ○ | ○ | ○ | ○ | | | | 850 | 909 |
| 13 | ○ | ○ | ○ | ○ | ○ | ○ | | | | 860 | 910 |
| 14 | ○ | ○ | ○ | ○ | ○ | ○ | | | | 840 | 920 |
| 15 | ○ | ○ | ○ | ○ | ○ | ○ | | | | 700 | 840 |

(Additive Oxide)

$ZrO_2$ powder, $Al_2O_3$ powder, $TiO_2$ powder, and $Mg_2SiO_4$ powder were provided. In addition, mixed powder containing $ZrO_2$, $Al_2O_3$, $TiO_2$, and $Mg_2SiO_4$ at a weight ratio of 25:25:25:25 was provided.

(Preparation of Paste)

Each marking paste was obtained by mixing the borosilicate glass sample shown in Table 1, a black oxide, and an additive oxide at the proportion shown in Table 2 to obtain a mixture, adding 5 parts by mass of ethyl cellulose as an organic binder and 90 parts by mass of butyl carbitol as a solvent per 100 parts by mass of the mixture, and mixing them at room temperature.

In addition, mixed main component powder 1 containing $Mg_2SiO_4$ and a $BaO$—$Nd_2O_3$—$TiO_2$-based ceramic at a mass ratio of 30:70 was provided.

Mixed main component powder 2 containing $Mg_2SiO_4$ and $CaTiO_3$ at a mass ratio of 91:9 was provided.

Mixed main component powder 3 containing $Mg_2SiO_4$ and $SrTiO_3$ at a mass ratio of 88:12 was provided.

Mixed main component powder 4 containing $Mg_2SiO_4$, a $BaO$—$Nd_2O_3$—$TiO_2$-based ceramic, $CaTiO_3$, and $SrTiO_3$ at a mass ratio of 40:40:10:10 was provided.

(Accessory Components)

Accessory component 1: $SiO_2$—$Li_2O$—$Al_2O_3$—$CaO$—$BaO$—$B_2O_3$ glass

TABLE 2

| Marking paste No. | Black oxide Kind Number | Black oxide Proportion % by mass | Borosilicate glass Kind Number | Borosilicate glass Softening point (° C.) | Borosilicate glass Crystallization temperature (° C.) | Borosilicate glass Proportion % by mass | Additive oxide Kind | Additive oxide Proportion % by mass |
|---|---|---|---|---|---|---|---|---|
| 1 | 1 | 15 | 1 | 820 | 900 | 77.5 | $ZrO_2$ | 7.5 |
| 2 | 2 | 15 | 1 | 820 | 900 | 77.5 | $ZrO_2$ | 7.5 |
| 3 | 3 | 15 | 1 | 820 | 900 | 77.5 | $ZrO_2$ | 7.5 |
| 4 | 4 | 15 | 1 | 820 | 900 | 77.5 | $ZrO_2$ | 7.5 |
| 5 | 2 | 10 | 1 | 820 | 900 | 80 | $ZrO_2$ | 10 |
| 6 | 2 | 8 | 1 | 820 | 900 | 82 | $ZrO_2$ | 10 |
| 7 | 2 | 5 | 1 | 820 | 900 | 87 | $ZrO_2$ | 8 |
| 8 | 2 | 4 | 1 | 820 | 900 | 88 | $ZrO_2$ | 8 |
| 9 | 2 | 20 | 1 | 820 | 900 | 70 | $ZrO_2$ | 10 |
| 10 | 2 | 30 | 1 | 820 | 900 | 65 | $ZrO_2$ | 5 |
| 11 | 2 | 31 | 1 | 820 | 900 | 64 | $ZrO_2$ | 5 |
| 12 | 2 | 15 | 2 | 800 | 880 | 77.5 | $ZrO_2$ | 7.5 |
| 13 | 2 | 15 | 3 | 840 | 909 | 77.5 | $ZrO_2$ | 7.5 |
| 14 | 2 | 15 | 4 | 800 | 860 | 77.5 | $ZrO_2$ | 7.5 |
| 15 | 2 | 15 | 5 | 840 | 900 | 77.5 | $ZrO_2$ | 7.5 |
| 16 | 2 | 15 | 6 | 810 | 880 | 77.5 | $ZrO_2$ | 7.5 |
| 17 | 2 | 15 | 7 | 800 | 880 | 77.5 | $ZrO_2$ | 7.5 |
| 18 | 2 | 15 | 8 | 760 | 850 | 77.5 | $ZrO_2$ | 7.5 |
| 19 | 2 | 15 | 9 | 700 | 850 | 77.5 | $ZrO_2$ | 7.5 |
| 20 | 2 | 15 | 10 | 690 | 850 | 77.5 | $ZrO_2$ | 7.5 |
| 21 | 2 | 15 | 11 | 830 | 909 | 77.5 | $ZrO_2$ | 7.5 |
| 22 | 2 | 15 | 12 | 850 | 909 | 77.5 | $ZrO_2$ | 7.5 |
| 23 | 2 | 15 | 13 | 860 | 910 | 77.5 | $ZrO_2$ | 7.5 |
| 24 | 2 | 15 | 14 | 840 | 920 | 77.5 | $ZrO_2$ | 7.5 |
| 25 | 2 | 15 | 15 | 700 | 840 | 77.5 | $ZrO_2$ | 7.5 |
| 26 | 2 | 10 | 1 | 820 | 900 | 80 | $ZrO_2$ | 10 |
| 27 | 2 | 7 | 1 | 820 | 900 | 90 | $ZrO_2$ | 3 |
| 28 | 2 | 6 | 1 | 820 | 900 | 91 | $ZrO_2$ | 3 |
| 29 | 2 | 20 | 1 | 820 | 900 | 60 | $ZrO_2$ | 20 |
| 30 | 2 | 25 | 1 | 820 | 900 | 55 | $ZrO_2$ | 20 |
| 31 | 2 | 25 | 1 | 820 | 900 | 50 | $ZrO_2$ | 25 |
| 32 | 2 | 25 | 1 | 820 | 900 | 49 | $ZrO_2$ | 26 |
| 33 | 2 | 15 | 1 | 820 | 900 | 77.5 | $Al_2O_3$ | 7.5 |
| 34 | 2 | 15 | 1 | 820 | 900 | 77.5 | $TiO_2$ | 7.5 |
| 35 | 2 | 15 | 1 | 820 | 900 | 77.5 | $Mg_2SiO_4$ | 7.5 |
| 36 | 2 | 15 | 1 | 820 | 900 | 77.5 | Mixed powder | 7.5 |
| 37 | 2 | 10 | 1 | 820 | 900 | 70 | $ZrO_2$ | 20 |
| 38 | 2 | 10 | 1 | 820 | 900 | 65 | $ZrO_2$ | 25 |
| 39 | 2 | 10 | 1 | 820 | 900 | 60 | $ZrO_2$ | 30 |
| 40 | 2 | 10 | 1 | 820 | 900 | 59 | $ZrO_2$ | 31 |
| 41 | 2 | 20 | 1 | 820 | 900 | 75 | $ZrO_2$ | 5 |
| 42 | 2 | 20 | 1 | 820 | 900 | 77.5 | $ZrO_2$ | 2.5 |
| 43 | 2 | 20 | 1 | 820 | 900 | 78 | $ZrO_2$ | 2 |

Mixed powder: $ZrO_2$, $Al_2O_3$, $TiO_2$, and $Mg_2SiO_4$ are contained at a weight ratio of 25:25:25:25.

Preparation of Paste for Green Sheet

The following components were provided as row materials of dielectric ceramic compositions for forming electronic component element bodies.

(Main Component)

Forsterite ($Mg_2SiO_4$) powder, $BaO$—$Nd_2O_3$—$TiO_2$-based ceramic powder, calcium titanate ($CaTiO_3$) powder, and strontium titanate ($SrTiO_3$) powder were provided.

Accessory component 2: $SiO_2$—$Li_2O$—$Al_2O_3$—$CaO$—$BaO$—$B_2O_3$—$ZnO$ glass Accessory component 3: $SiO_2$—$Li_2O$—$Al_2O_3$—$CaO$—$BaO$ glass Accessory component 4: $SiO_2$—$Li_2O$ glass Accessory component 5: $SiO_2$—$Li_2O$—$ZnO$ glass Accessory component 6: $SiO_2$—$Li_2O$—$B_2O_3$ glass Accessory component 7: $SiO_2$—$Li_2O$—$Al_2O_3$—$B_2O_3$ glass Accessory component 8: $SiO_2$—$Li_2O$—$Al_2O_3$—$B_2O_3$—ZnO glass (Preparation of Paste)

The above-described main components and accessory components were mixed in the combinations shown in Table 3 to obtain respective mixtures in each of which an amount of the main component was 100 parts by mass and an amount of the accessory component was 10 pars by mass. With each of the mixtures, 10 parts by mass of polyvinyl butyral resin, 5 pars by mass of dioctyl phthalate (DOP), and 100 parts by mass of alcohol as a solvent were mixed per 100 parts by mass of the mixture using a bead mill, and each of the resultant mixtures was made into paste to obtain a paste for a green sheet.

TABLE 3

| Paste No. | Paste for a green sheet | |
|---|---|---|
| | Main component | Accessory component |
| 1 | $Mg_2SiO_4$ | 1 |
| 2 | $BaO$—$Nd_2O_3$—$TiO_2$ | 1 |
| 3 | $CaTiO_3$ | 1 |
| 4 | $SrTiO_3$ | 1 |
| 5 | Mixed main component powder 1 | 1 |
| 6 | Mixed main component powder 2 | 1 |
| 7 | Mixed main component powder 3 | 1 |
| 8 | Mixed main component powder 4 | 1 |
| 9 | $Mg_2SiO_4$ | 2 |
| 10 | $Mg_2SiO_4$ | 3 |
| 11 | $Mg_2SiO_4$ | 4 |
| 12 | $Mg_2SiO_4$ | 5 |
| 13 | $Mg_2SiO_4$ | 6 |
| 14 | $Mg_2SiO_4$ | 7 |
| 15 | $Mg_2SiO_4$ | 8 |

Preparation of Evaluation Sample

The paste for a green sheet and the marking pastes used for preparing respective evaluation samples are shown in Table 4. A green sheet was formed on a PET film using each of the paste for a green sheet so that the thickness after drying became 40 μm. Thereafter, the marking paste was screen-printed at a predetermined position on the green sheet. The screen-printed mark had a rectangular shape with a size of 0.6 mm×0.6 mm, and the film thickness of the mark was about 15 μm.

Plural green sheets on each of which a Ag conductor paste had been printed in advance were subsequently stacked, and a green sheet on which a marking paste had been printed was further stacked thereon, with the print surface being the top surface. Further, a layer of a green sheet having a thickness of 20 μm was stacked on the surface on which the marking paste had been printed to obtain a stacked body.

Thereafter, this stacked body was cut into a predetermined dimension to obtain a green chip. The green chip was then heated to be subjected to binder removal treatment. The green chip was then fired at 910° C. and made into a sintered body which was used as an evaluation sample.

Visibility of the mark, adhesiveness, and cracking and breaking of each evaluation sample were evaluated according to the above methods. Results are shown in Table 4 together with amounts of Zn (amounts of Zn (in terms of ZnO) based on 100% by mass of inorganic solid contents (in terms of oxides) contained in the black marker compositions) and softening points and crystallization temperatures of borosilicate glass samples contained in the black marker compositions. Sample Nos. 12, 14, and 16 are comparative examples in which amounts of Zn in terms of ZnO exceed 0.05% by mass based on 100% by mass of inorganic solid contents (in terms of oxides) contained in the black marker compositions. Sample No. 24 is a comparative example in which the crystallization temperature of the borosilicate glass is 910° C. or more.

TABLE 4

| Sample No. | Marking paste | | | Paste for green sheet No. | Evaluation | | | Total evaluation A to E |
|---|---|---|---|---|---|---|---|---|
| | Paste No. | Softening point (° C.) | Crystallization temperature (° C.) | Amount of ZnO (% by mass) | | Visibility (contrast) | Adhesiveness (peeling) | Cracking/ breaking | |
| 1 | 1 | 820 | 900 | <0.05 | 1 | B | A | A | B |
| 2 | 2 | 820 | 900 | <0.05 | 1 | A | A | A | A |
| 3 | 3 | 820 | 900 | <0.05 | 1 | A | A | A | A |
| 4 | 4 | 820 | 900 | <0.05 | 1 | A | A | A | A |
| 5 | 5 | 820 | 900 | <0.05 | 1 | A | A | A | A |
| 6 | 6 | 820 | 900 | <0.05 | 1 | B | A | A | B |
| 7 | 7 | 820 | 900 | <0.05 | 1 | C | A | A | C |
| 8 | 8 | 820 | 900 | <0.05 | 1 | D | A | A | D |
| 9 | 9 | 820 | 900 | <0.05 | 1 | A | A | A | A |
| 10 | 10 | 820 | 900 | <0.05 | 1 | A | C | A | C |
| 11 | 11 | 820 | 900 | <0.05 | 1 | A | D | A | D |
| 12 | 12 | 800 | 880 | 1.0 | 1 | E | A | A | E |
| 13 | 13 | 840 | 909 | <0.05 | 1 | A | B | A | B |
| 14 | 14 | 800 | 860 | 5.0 | 1 | E | A | B | E |
| 15 | 15 | 840 | 900 | <0.05 | 1 | A | B | A | B |
| 16 | 16 | 810 | 880 | 5.0 | 1 | E | A | A | E |
| 17 | 17 | 800 | 880 | <0.05 | 1 | A | A | A | A |
| 18 | 18 | 760 | 850 | <0.05 | 1 | A | A | B | B |
| 19 | 19 | 700 | 850 | <0.05 | 1 | A | A | C | C |
| 20 | 20 | 690 | 850 | <0.05 | 1 | A | A | D | D |
| 21 | 21 | 830 | 909 | <0.05 | 1 | A | A | A | A |
| 22 | 22 | 850 | 909 | <0.05 | 1 | A | C | B | C |
| 23 | 23 | 860 | 910 | <0.05 | 1 | A | D | B | D |
| 24 | 24 | 840 | 920 | <0.05 | 1 | A | B | E | E |
| 25 | 25 | 700 | 840 | <0.05 | 1 | A | C | D | D |
| 26 | 26 | 820 | 900 | <0.05 | 1 | A | A | A | A |
| 27 | 27 | 820 | 900 | <0.05 | 1 | C | A | C | C |

TABLE 4-continued

| | | Marking paste | | | | Evaluation | | | Total |
|---|---|---|---|---|---|---|---|---|---|
| Sample No. | Paste No. | Softening point (° C.) | Crystallization temperature (° C.) | Amount of ZnO (% by mass) | Paste for green sheet No. | Visibility (contrast) | Adhesiveness (peeling) | Cracking/ breaking | evaluation A to E |
| 28 | 28 | 820 | 900 | <0.05 | 1 | D | A | C | D |
| 29 | 29 | 820 | 900 | <0.05 | 1 | A | A | A | A |
| 30 | 30 | 820 | 900 | <0.05 | 1 | A | B | A | B |
| 31 | 31 | 820 | 900 | <0.05 | 1 | B | C | A | C |
| 32 | 32 | 820 | 900 | <0.05 | 1 | B | D | A | D |
| 33 | 33 | 820 | 900 | <0.05 | 1 | B | A | A | B |
| 34 | 34 | 820 | 900 | <0.05 | 1 | B | A | A | B |
| 35 | 35 | 820 | 900 | <0.05 | 1 | B | A | A | B |
| 36 | 36 | 820 | 900 | <0.05 | 1 | A | A | A | A |
| 37 | 37 | 820 | 900 | <0.05 | 1 | A | A | A | A |
| 38 | 38 | 820 | 900 | <0.05 | 1 | B | A | A | B |
| 39 | 39 | 820 | 900 | <0.05 | 1 | C | A | A | C |
| 40 | 40 | 820 | 900 | <0.05 | 1 | D | B | A | D |
| 41 | 41 | 820 | 900 | <0.05 | 1 | A | A | A | A |
| 42 | 42 | 820 | 900 | <0.05 | 1 | A | A | C | C |
| 43 | 43 | 820 | 900 | <0.05 | 1 | A | A | D | D |
| 44 | 2 | 820 | 900 | <0.05 | 2 | A | A | A | A |
| 45 | 2 | 820 | 900 | <0.05 | 3 | A | A | A | A |
| 46 | 2 | 820 | 900 | <0.05 | 4 | A | A | A | A |
| 47 | 2 | 820 | 900 | <0.05 | 5 | A | A | A | A |
| 48 | 2 | 820 | 900 | <0.05 | 6 | A | A | A | A |
| 49 | 2 | 820 | 900 | <0.05 | 7 | A | A | A | A |
| 50 | 2 | 820 | 900 | <0.05 | 8 | A | A | A | A |
| 51 | 2 | 820 | 900 | <0.05 | 9 | A | A | A | A |
| 52 | 2 | 820 | 900 | <0.05 | 10 | A | A | A | A |
| 53 | 2 | 820 | 900 | <0.05 | 11 | A | A | A | A |
| 54 | 2 | 820 | 900 | <0.05 | 12 | A | A | A | A |
| 55 | 2 | 820 | 900 | <0.05 | 13 | A | A | A | A |
| 56 | 2 | 820 | 900 | <0.05 | 14 | A | A | A | A |
| 57 | 2 | 820 | 900 | <0.05 | 15 | A | A | A | A |

REFERENCE SIGNS LIST

1 . . . element body
6-9 . . . terminal electrode
10 . . . mark
11 . . . electronic component

What is claimed is:

1. A black marker composition, comprising borosilicate glass and a black oxide, wherein a crystallization temperature of the borosilicate glass is 850° C. or more and less than 910° C., and
an amount of Zn in terms of ZnO is 0.05% by mass or less based on 100% by mass of an inorganic solid content in terms of oxides contained in the black marker composition.

2. The black marker composition according to claim 1, wherein the black oxide contains Fe and Mn and also contains one or more elements selected from the group consisting of Cr, Ni, Cu, and Co.

3. The black marker composition according to claim 1, wherein a softening point of the borosilicate glass is equal to or less than the crystallization temperature and is within a range of 700° C.-850° C.

4. The black marker composition according to claim 1, wherein an amount of the borosilicate glass is 50 to 90% by mass.

5. The black marker composition according to claim 1, wherein an amount of the black oxide is 5 to 30% by mass.

6. The black marker composition according to claim 1, comprising one or more additive oxides selected from the group consisting of $ZrO_2$, $Al_2O_3$, $TiO_2$, and $Mg_2SiO_4$.

7. The black marker composition according to claim 6, wherein the additive oxide includes $ZrO_2$.

8. The black marker composition according to claim 6, wherein an amount of the additive oxide is 2.5 to 30% by mass.

9. An electronic component having a mark formed of the black marker composition according to claim 1 on a surface of an element body.

10. A communication device having the electronic component according to claim 9.

11. The electronic component according to claim 9, wherein
the element body has a structure in which a dielectric layer and an internal electrode layer are stacked,
the internal electrode includes Ag, and
the dielectric layer is capable of being fired simultaneously with Ag and includes a dielectric ceramic composition sinterable at a temperature of 910° C. or less.

12. The electronic component according to claim 11, wherein the dielectric ceramic composition comprises one or more selected from the group consisting of $Mg_2SiO_4$, $(Ca_xBa_ySr_{1-x-y})TiO_3$ in which x and y are 1.0 to 0.0, and a $BaO$—$Nd_2O_3$—$TiO_2$-based ceramic.

13. A black marker composition, comprising borosilicate glass and a black oxide, wherein a crystallization temperature of the borosilicate glass is less than 910° C., and a softening point of the borosilicate glass is equal to or less than the crystallization temperature and is within a range of 700° C.-850° C., and
an amount of Zn in terms of ZnO is 0.05% by mass or less based on 100% by mass of an inorganic solid content in terms of oxides contained in the black marker composition.

14. An electronic component having a mark formed of the black marker composition according to claim 13 on a surface of an element body.

15. A communication device having the electronic component according to claim 14.

* * * * *